United States Patent [19]

Hamasaki

[11] Patent Number: 4,660,064
[45] Date of Patent: Apr. 21, 1987

[54] CHARGE COUPLED DEVICE HAVING A FLOATING DIFFUSION REGION AND A PRECHARGE DIFFUSION REGION WHICH ARE ALIGNED SO AS TO INCREASE THE OUTPUT GAIN

[75] Inventor: Masaharu Hamasaki, Kanagawa, Japan

[73] Assignee: Sony Corporation, Tokyo, Japan

[21] Appl. No.: 824,452

[22] Filed: Jan. 31, 1986

[30] Foreign Application Priority Data

Feb. 5, 1985 [JP] Japan .................................. 60-20684

[51] Int. Cl.⁴ ...................... H01L 29/78; G11C 19/28
[52] U.S. Cl. .......................................... 357/24; 377/60
[58] Field of Search ...................... 357/24; 377/57-63

[56] References Cited

U.S. PATENT DOCUMENTS 4,389,615 6/1983 French et al. ........................ 357/24

Primary Examiner—Gene M. Munson

[57] ABSTRACT

A charge transfer device which has an output section that forms a floating diffusion-type amplifier in which a precharge gate electrode is mounted such that a channel formed between a corner portion of a floating diffusion region and the precharged drain region is mounted at an angle so as to reduce the contact surface between the floating diffusion region and the precharge gate electrode to thus improve the characteristics of the device.

2 Claims, 5 Drawing Figures

CHARGE COUPLED DEVICE HAVING A FLOATING DIFFUSION REGION AND A PRECHARGE DIFFUSION REGION WHICH ARE ALIGNED SO AS TO INCREASE THE OUTPUT GAIN

BACKGROUND OF THE INVENTION

1. Field of the Invention

This invention relates in general to charge transfer devices using a charge coupled device and more particularly to an output structure of such device.

2. Description of the Prior Art

For the output section of a CCD charge transfer device of a solid state imager, there is employed an output section in which a so-called floating diffusion-type amplifier is formed. The circuit diagram of FIG. 1 illustrates the floating diffusion-type amplifier which is formed such that a signal charge flowing from an output terminal of a CCD transfer section 1 to a diode 2 in a floating diffusion region is obtained as a change of voltage by an output amplifier 3, in other words, a gate as illustrated in FIG. 2 of an MOS transistor M1. A precharged or so-called reset MOS transistor 4 is connected as illustrated in FIG. 1.

FIG. 2 is a plan view of the output section and FIG. 3 is a cross-sectional view taken along line A—A shown in FIG. 2. As illustrated in FIGS. 2 and 3, a semiconductor substrate 11 of, for example, n-type is provided and a semiconductor well 12 of p-type is formed thereon as shown. A plurality of n-type regions 13 are formed in the major surface of the semiconductor well 12. On the n-type regions 13, there are formed a plurality of transfer electrodes 15 mounted above a gate insulating layer 14 which may be made of SiO$_2$ or other suitable material. This structure forms a CCD transfer section 1 as illustrated.

Two phase clock pulses $\phi_1$ and $\phi_2$ provide driving pulses which are supplied to the transfer electrodes 15. At the final stage of the CCD transfer section 1, there is provided an output gate portion 17 and a floating region of n+ type which is formed on the major surface of the semiconductor well 12 adjacent to the output gate portion 17. The floating diffusion region 18 is connected to a gate electrode 19 of the MOS transistor M1 which forms the output amplifier 3. A source region 20 and a drain region 21 of the MOS transistor M1 are indicated in FIG. 2. A channel stopper region 22 is provided as illustrated in FIG. 2. On the major surface of the semiconductor well 12, there is formed a precharge diffusion region 23 of n+ type which is in opposing relationship to the floating diffusion region 18. A channel forming region 24 of an n-type is formed on the major surface of the semiconductor well 12 between the regions 18 and 23. On the channel forming region 24, there is formed a precharge gate electrode 25 over the gate insulating layer 14. A precharge terminal PG is provided and a precharge drain terminal PD is also provided and an output gate terminal OG is also provided which is connected to gate portion 17.

The output gain of the floating diffusion type amplifier is determined by the floating diffusion region 18, that is the diode 2 and the ambient capacitances $C_B$, $C_P$, $C_O$, $C_I$ and $C_{in}$ as illustrated in FIG. 1. For this case, $C_B$ designates the sum of the capacitances between the floating diffusion region 18 and the P-type semicondcutor well 12 and the capacitance between the floating diffusion region 18 and the channel stopper region 22. $C_P$ designates the capacitance between the floating diffusion region 18 and the precharge gate electrode 25 and $C_O$ represents the capacitance between the floating diffusion region 18 and the output gate electrode 17. $C_I$ represents the wiring capacitance and $C_{in}$ represents the input capacitance of the output amplifier 3 formed within the same semiconductor chip as the CCD transfer section.

Therefore, if the voltage gain of the amplifier 3 is A, an output $V_{OUT}$ which is provided when a signal charge Q enters into the floating diffusion region 18 will be:

$$V_{OUT} = \frac{Q}{C_B + C_P + C_O + C_I + C_{in}} \cdot A \quad (1)$$

It should be noted that the decrease of the capacitances causes the output gain to increase. As illustrated in FIG. 3, the capacitance $C_P$ is the sum of a capacitance $C_1$ between the precharge gate electrode 25 and the wiring of the gate electrode 19 of the MOS transistor M1 and the capacitance $C_2$ between the floating diffusion region 18 and the precharge gate electrode 25.

Incidently, in the prior art structure as illustrated in FIG. 2, if the area and surrounding length of the square-shape floating diffusion region 18 are minimized and then the precharge gate electrode 25 is mounted, the contact length 1 between the floating diffusion region 18 and the precharge gate electrode 25 will be equal to the length of one side of the floating diffusion region 18. For this reason, there is a limit to decreasing the capacitance $C_p$.

SUMMARY OF THE INVENTION

It is an object of the present invention to provide a charge transfer device in which the capacitance in the output section which forms a floating diffusion-type amplifier is reduced over those of the prior art so that the output gain can be improved.

Another object of the invention is to provide a charge transfer device which improves the signal to noise ratio of the output signal.

According to one aspect of the invention, there is provided a charge transfer device in which an output section which forms a floating diffusion-type amplifier, a precharge gate electrode is mounted such that a channel is formed between a corner portion of the floating diffusion region at a precharge drain region.

These and other objects, features and advantages of the invention will become apparent from the following detailed description of the preferred embodiments taken in conjunction with the accompanying drawings wherein like reference numerals designate light elements and parts.

DESCRIPTION OF THE PREFERRED EMBODIMENTS

Figure 2:
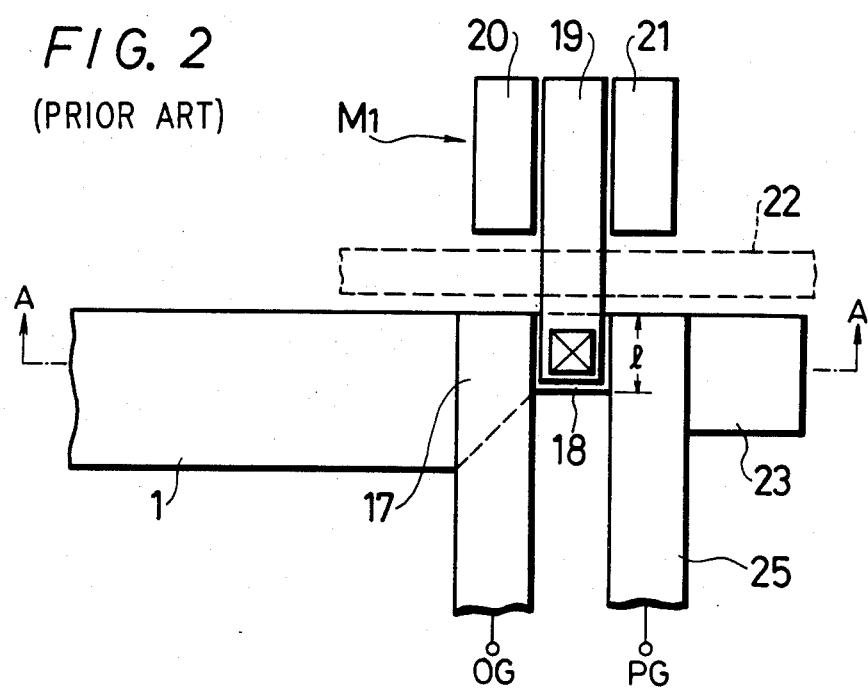
FIG. 2 is a schematic plan view of an output section of the prior art charge transfer device.
Figure 3:
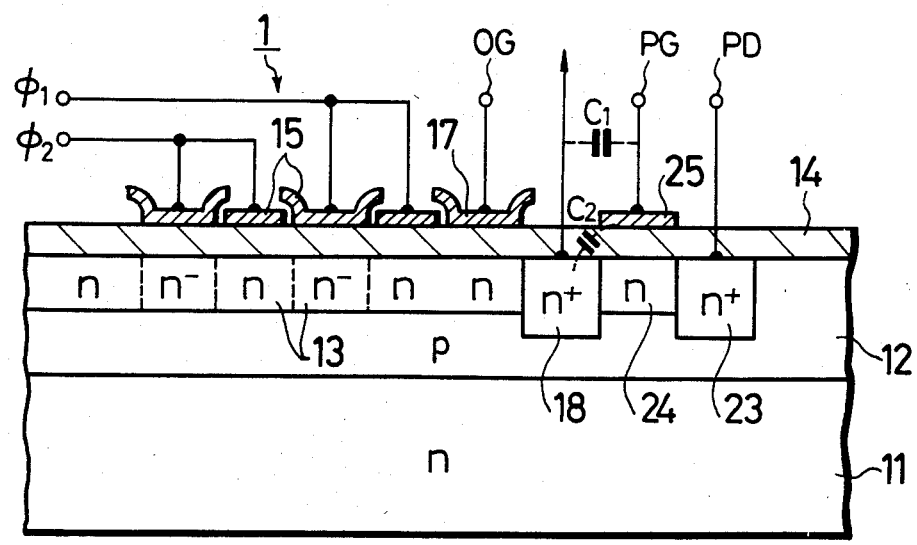
FIG. 3 is a sectional view taken on line A—A in FIG. 2.
Figure 4:
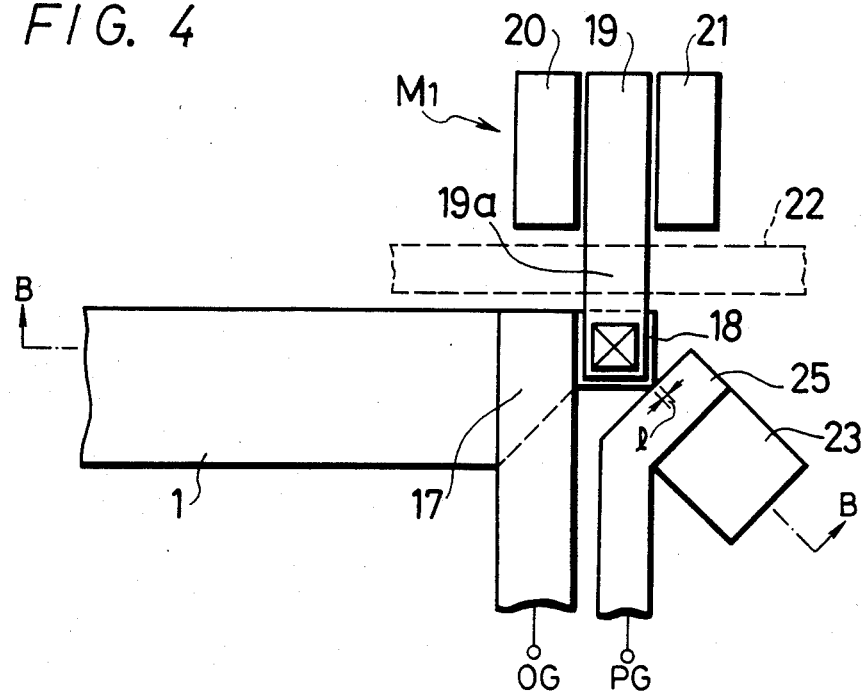
FIG. 4 is a schematic plan view illustrating an embodiment of an output section of a charge transfer device according to the present invention.
Figure 5:
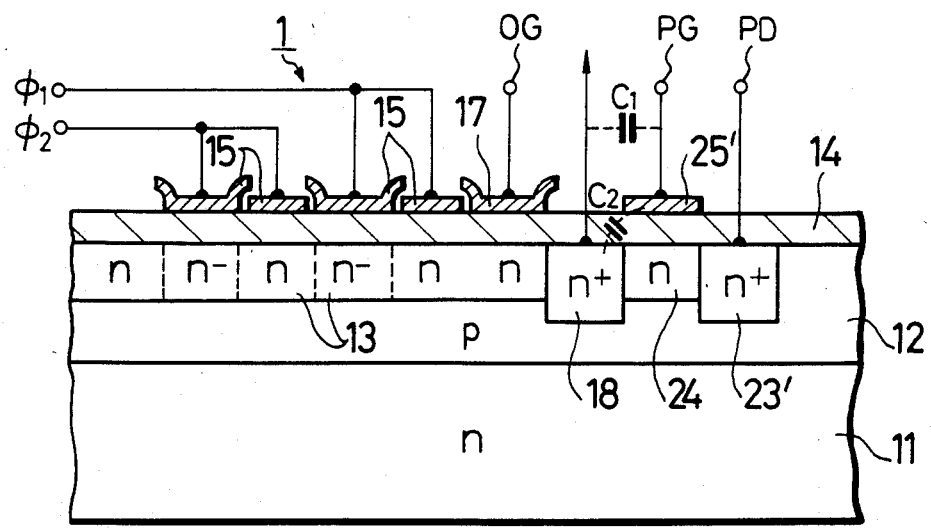
FIG. 5 is a sectional view taken along line B—B in FIG. 4.

FIGS. 4 and 5 illustrate the invention wherein parts which correspond to those of FIGS. 2 and 3 are identified with the same references.

In the invention, as in the example illustrated in FIGS. 2 and 3, the n-type regions 13 are formed on the major surface of the p-type semiconductor well 12 which is formed on the semiconductor substrate 11 which is, for example, n-type. On the n-type regions 13, there are formed a plurality of transfer electrodes 15 above the gate insulating layer 14 which may be made of $SiO_2$ so as to form the CCD transfer section 1.

Figure 1:
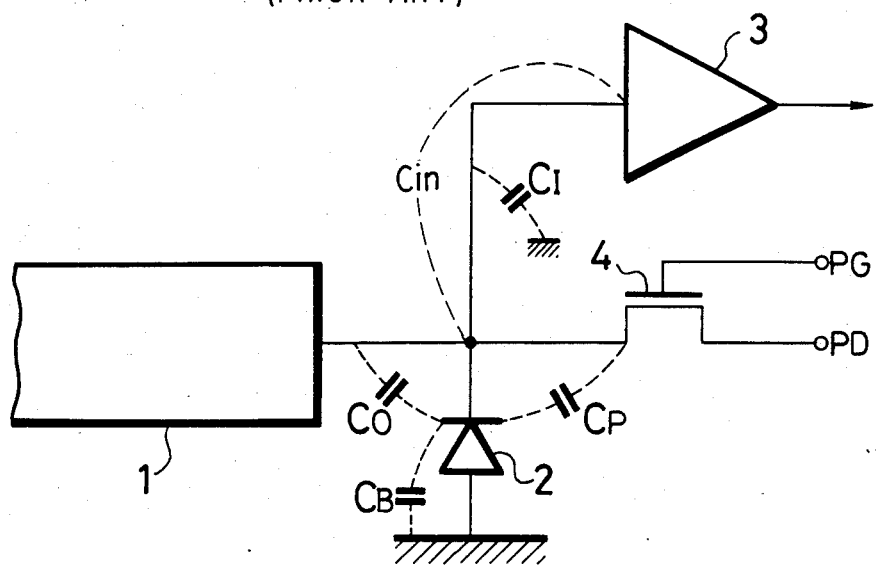
FIG. 1 is a circuit diagram illustrating an output section which forms a prior art floating diffusion-type amplifier.

The output gate portion 17 is formed on the layer 14 adjacent to the final stage of the CCD transfer section 1. Also, the floating diffusion region 18 of n+ type is formed on the major surface of the semiconductor well 12 adjacent to the output gate portion 17 and the floating diffusion region 18 is connected through an electrical conductor 19a to the gate electrode 19 of the MOS transistor M1 which forms the output amplifier 3 as illustrated in FIG. 1. The floating diffusion region 18 is formed to be generally square shaped in the plan view and the wiring 19a extends parallel to one side of the region 18 as shown. The source region 20 and the drain region 21 of the MOS transistor are formed as illustrated in FIG. 4. A channel stopper region 22 is provided and extends transverse to the source and drain regions 20 and 21.

In the invention as illustrated in FIG. 4, a precharged drain region 23' of n+ type is formed opposite the corner of the floating diffusion region 18 such that it is oriented approximately 45° relative to the floating diffusion region 18. On the n-type channel region 24 between the corner portion of the floating diffusion region 18 and the precharge drain region 23' there is formed a precharge gate electrode 25 over the gate insulating layer 14. As shown, the precharged gate electrode 25' is disposed at an angle as, for example, 45° relative to the sides of the floating diffusion region 18 and the wiring 19a which extends from the floating diffusion region 18 so that it is in contact with the corner portion of the floating diffusion region 18 as illustrated.

According to the present invention, since in the output section of the floating diffusion type amplifier, the precharge gate electrode 25 is formed such that the channel is formed between the corner portion of the floating diffusion region 18 and the precharge region 23', the contact length 1 between the floating diffusion region 18 and the precharge drain electrode 25' is substantially reduced and also the distance between the precharge gate electrode 25' and the conductor 19a which leads out from the floating diffusion region 18 is increased relative to the prior art. Particularly, when the precharged gate electrode 25' is formed at 45° relative to one side of the floating diffusion region 18, the contact length 1 will be minimized and the distance between the precharge gate electrode 25' and the wiring 19a which leads out from the floating diffusion region 18 will become maximum. Consequently, the area and the surrounding length of the floating diffusion region 18 can be minimized to thereby reduce the capacitance $C_B$ and also the capacitance $C_2$ between the floating diffusion region 18 and the precharge gate electrode 25'. Also, the capacitance $C_1$ between the precharge gate electrode 25 and the gate wiring 19a of the MOS transistor M1 will be minimized and thus the capacitance $C_P$ will be minimized. Thus, the output gain of the floating diffusion-type amplifier according to the invention can be increased and the S/N ratio of the output signal will be improved.

Thus, in the present invention, the orientation of the precharge diffusion region 23 illustrated in FIG. 2 is moved to the bias position as, for example, 45° orientation relative to the floating diffusion region 18 as illustrated in FIG. 4 and also the precharged gate electrode 25' is moved to take the shape illustrated in FIG. 4 to thus result in an improved device.

Although the invention has been described with respect to preferred embodiments, it is not to be so limited as changes and modifications may be made by those skilled in the art without departing from the spirit and scope of the novel concepts of the invention as determined by the appended claims.

I claim as my invention:

1. A charge transfer device which has an output section which is a floating diffusion type comprising a semiconductor substrate, a floating diffusion region formed in said substrate adjacent the output of said charge transfer device and in a first plan view formed with two straight lines which form a substantially 90 degree corner which defines its outer limits, a precharge drain formed in said substrate and in a first plan view formed with a straight edge which defines its limits and which is aligned at substantially 45 degrees to said two straight lines which form said 90 degree corner of said floating diffusion region, and a pre-charge gate electrode formed in said substrate and having two parallel edges in a first plan view and located between said pre-charge drain region and said floating diffusion region such that one of said parallel edges is adjacent to and extends in the same direction as said straight edge of said pre-charge drain and the other edge of said pre-charge gate electrode in said first plan view is adjacent said 90 degree corner of said floating diffusion region and is aligned at substantially 45 degrees to said two straight lines which form said 90 degree corner of said floating diffusion region.

2. A charge transfer device according to claim 1 including a channel forming region formed in said substrate under said pre-charge gate electrode.

* * * * *